United States Patent
Lin et al.

(10) Patent No.: US 7,120,032 B2
(45) Date of Patent: Oct. 10, 2006

(54) EXPANSION CARD MOUNTING APPARATUS

(75) Inventors: Kuo-Chih Lin, Tu-Chen (TW); Yi Ze Fang, Shenzhen (CN)

(73) Assignees: Hong Fujin Precision Ind. (Shenzhen) Co., Ltd., Shenzhen (CN); Hon Hai Precision Ind. Co., Ltd., Tu-Cheng (TW)

( * ) Notice: Subject to any disclaimer, the term of this patent is extended or adjusted under 35 U.S.C. 154(b) by 218 days.

(21) Appl. No.: 10/654,288

(22) Filed: Sep. 2, 2003

(65) Prior Publication Data

US 2004/0184252 A1 Sep. 23, 2004

(30) Foreign Application Priority Data

Mar. 19, 2003 (TW) .............................. 92204269 U

(51) Int. Cl.
*H05K 7/14* (2006.01)
*H05K 7/18* (2006.01)

(52) U.S. Cl. ........................ 361/801; 361/755; 361/683

(58) Field of Classification Search ........ 361/801–802, 361/755, 796, 683, 740, 725; 211/41.17, 211/13.1

See application file for complete search history.

(56) References Cited

U.S. PATENT DOCUMENTS

| 4,745,524 | A |   | 5/1988  | Patton, III |         |
|-----------|---|---|---------|-------------|---------|
| 5,317,483 | A |   | 5/1994  | Swindler    |         |
| 5,936,835 | A |   | 8/1999  | Astier      |         |
| 6,138,839 | A | * | 10/2000 | Cranston et al. | 211/41.17 |
| 6,182,835 | B1| * | 2/2001  | Chen        | 211/13.1 |
| 6,231,139 | B1| * | 5/2001  | Chen        | 312/223.2 |
| 6,480,392 | B1| * | 11/2002 | Jiang       | 361/755 |
| 6,674,650 | B1| * | 1/2004  | Davis et al.| 361/796 |
| 6,738,261 | B1| * | 5/2004  | Vier et al. | 361/740 |

* cited by examiner

*Primary Examiner*—Kamand Cuneo
*Assistant Examiner*—Hung S. Bui
(74) *Attorney, Agent, or Firm*—Wei Te Chung

(57) ABSTRACT

An expansion card mounting apparatus includes a rear panel (14) defining an opening (16), a mounting frame (20) attached to the rear panel around the opening, a pressing body (30) pivotably mounted to the mounting frame, and two retention members (40) attached to opposite sides of the mounting frame. The mounting frame includes a support plate (22) for supporting an end portion (122) of a slot cover (120) of an expansion card (100). Each retention member defines a retention portion (40B) having a protrusion (44) formed thereon. When the pressing body is pivoted to an engaging position in which the pressing body presses the end portion against the support plate, the protrusion snappingly engages with opposite ends of the pressing body so as to retain the pressing body in said engaging position.

20 Claims, 6 Drawing Sheets

EXPANSION CARD MOUNTING APPARATUS

BACKGROUND OF THE INVENTION

1. Field of the Invention

The present invention relates to mounting apparatuses, and more particularly to a mounting apparatus for readily and securely mounting expansion cards in a computer enclosure.

2. Related Art

Many computer systems comprise not only a motherboard, but also one or more expansion cards electrically connected to the motherboard to provide specialized functions. It is required that the expansion cards be reliably retained within the computer enclosure to prevent disengagement from the motherboard when the computer is subjected to shock and vibration during delivery and use thereof.

U.S. Pat. No. 5,317,483 discloses a mounting apparatus for mounting an expansion card to a chassis. The mounting apparatus includes a pressing body having one end pivotably mounted to a support plate of the chassis. After the pressing body pivots to a position in which slot covers of expansion cards are sandwiched between the pressing body and the support plate, the other end of the pressing body is fastened to the support plate with a screw. The expansion cards are thus secured to chassis.

U.S. Pat. No. 5,936,835 also discloses an expansion card mounting apparatus. The mounting apparatus has a plurality of spring fingers and a mounting portion. After the mounting apparatus is disposed in a position in which the spring fingers respectively press corresponding slot covers of expansion cards, the mounting portion is screwed to the chassis. The expansion cards are thus secured to the chassis.

Both of the above-mentioned prior art apparatuses can mount a plurality of expansion cards at one time. However, when installing or removing several expansion cards, using the screw fasteners is laborious and time-consuming. In addition, a tool such as a screwdriver or a wrench is usually required.

SUMMARY OF THE INVENTION

Accordingly, an object of the present invention is to provide an apparatus for easy and quick installation and removal of expansion cards to and from equipment such as a chassis of a computer.

To achieve the above-mentioned object, an expansion card mounting apparatus in accordance with a preferred embodiment of the present invention comprises a rear panel defining an opening, a mounting frame attached to the real panel around the opening, a pressing body pivotably mounted to the mounting frame, and a pair of retention members. The mounting frame comprises a support plate for supporting an end portion of a slot cover of an expansion card. The retention members are attached to opposite sides of the mounting frame respectively and each comprises a retention portion. A protrusion is formed at the retention portion. When the pressing body is rotated to an engaging position in which the pressing body presses the end portion against the support plate, the protrusion snappingly engages with the pressing body so as to retain the pressing body in said engaging position.

Other objects, advantages and novel features of the present invention will be drawn from the following detailed description of the preferred embodiment of the present invention with attached drawings, in which:

DESCRIPTION OF THE PREFERRED EMBODIMENTS

The present invention will be described in its preferred embodiments, and in conjunction with an expansion card.

Figure 1:
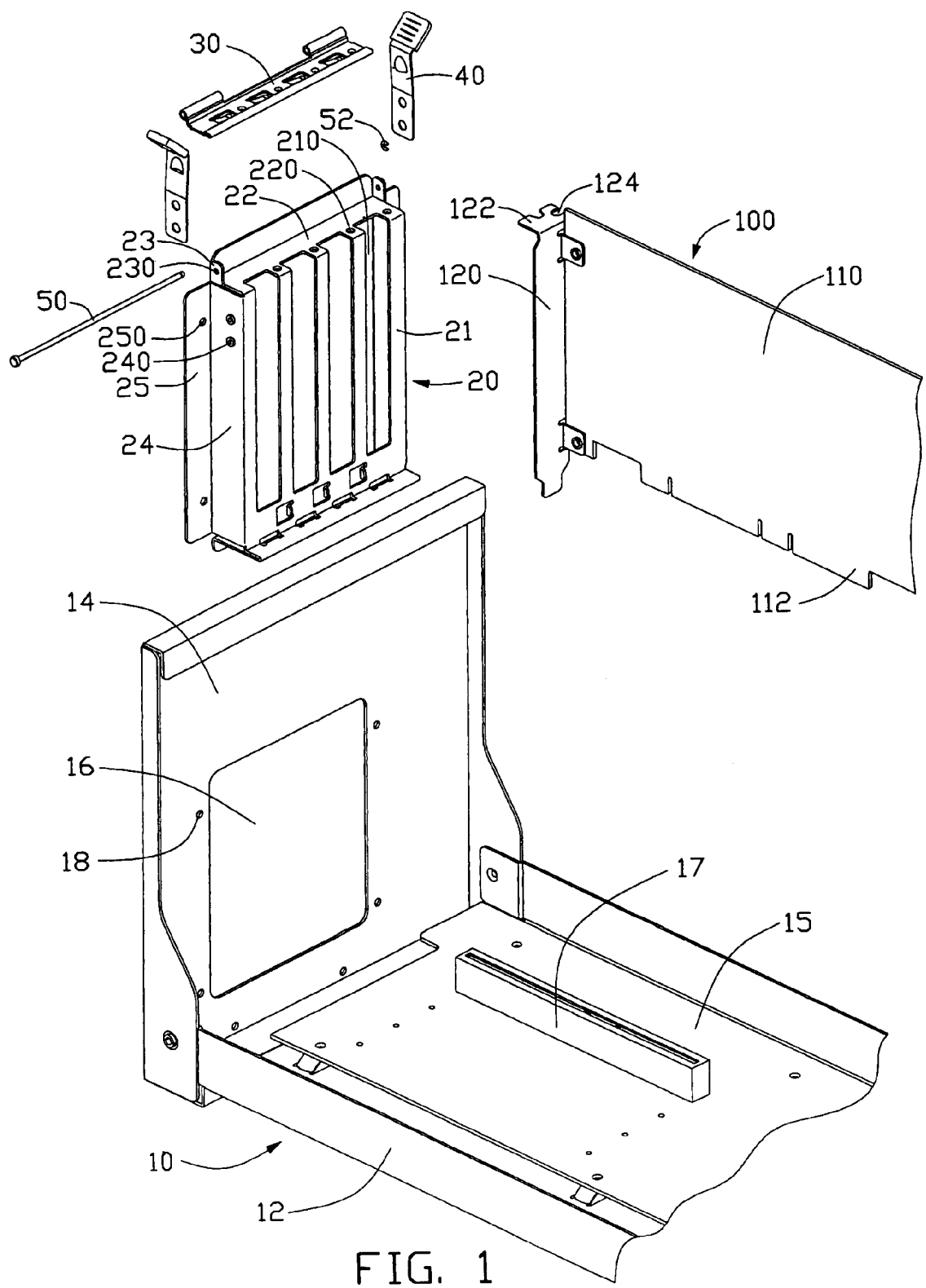
FIG. 1 is an exploded, isometric view of an expansion card mounting apparatus in accordance with the preferred embodiment of the present invention, together with an expansion card; the expansion card mounting apparatus comprising a chassis, a mounting frame, a pressing body, a pair of retention members and a pivot axle.

FIG. 1 shows an expansion card mounting apparatus in accordance with the preferred embodiment of the present invention, together with an expansion card 100. The mounting apparatus comprises a chassis 10, a mounting frame 20, a pressing body 30, a pivot axle 50 for pivotably mounting the pressing body 30 to the mounting frame 20, and a pair of retention members 40 for retaining the pressing body 30 in a predetermined position.

The expansion card 100 comprises a printed circuit board 110, and a slot cover 120 attached to an end of the printed circuit board 110. The printed circuit board 110 comprises an edge connecting portion 112. The slot cover 120 comprises a bent end portion 122 defining a cutout 124.

The chassis 10 comprises a bottom panel 12, and a rear panel 14 extending from an end of the bottom panel 12. The bottom panel 12 has a motherboard 15 attached thereon. The motherboard 15 has a connector 17, corresponding to the connection portion 112 of the expansion card 100. A rectangular opening 16 is defined in the rear panel 14. A plurality of mounting holes 18 is defined in the rear panel 14 around the opening 16.

The mounting frame 20 is used to mount the slot cover 120 of the expansion card 100 at the rear panel 14. The mounting frame 20 comprises a vertical plate 21. A plurality of evenly spaced vertical expansion slots 210 is defined in the vertical plate 21. A support plate 22 extends rearwardly from a top end of the vertical plate 21. The expansion slots 210 each span to a portion of the support plate 22. A plurality of evenly spaced positioning holes 220 is defined in the support plate 22, adjacent the expansion slots 210 respectively. A pair of projections 23 extends upwardly from opposite sides of the support plate 23 respectively. Each projection 23 defines a pivot hole 230. A pair of side plates 24 extends rearwardly from opposite sides of the vertical plate 21 respectively. A pair of hollow mounting posts 240 is formed from an upper portion of each side plate 24. Each side plate 24 is bent perpendicularly to form a mounting plate 25. A pair of mounting holes 250 is defined in each mounting plate 25, corresponding to two respective mounting holes 18 of the rear panel 14. Using fasteners such as screws or bolts extending through the corresponding mounting holes 18, 250 of the rear panel 14 and mounting plates 25, the mounting frame 20 can be mounted to the rear panel 14 around the opening 16 thereof.

Figure 2:
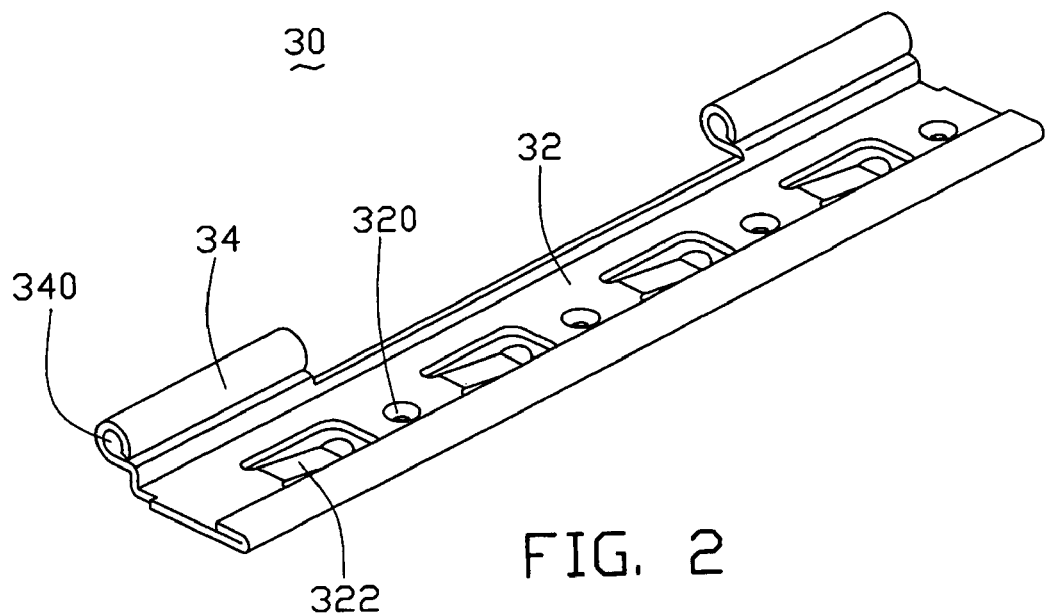
FIG. 2 is an enlarged, isometric view of the pressing body of the mounting apparatus of FIG. 1.
Figure 4:
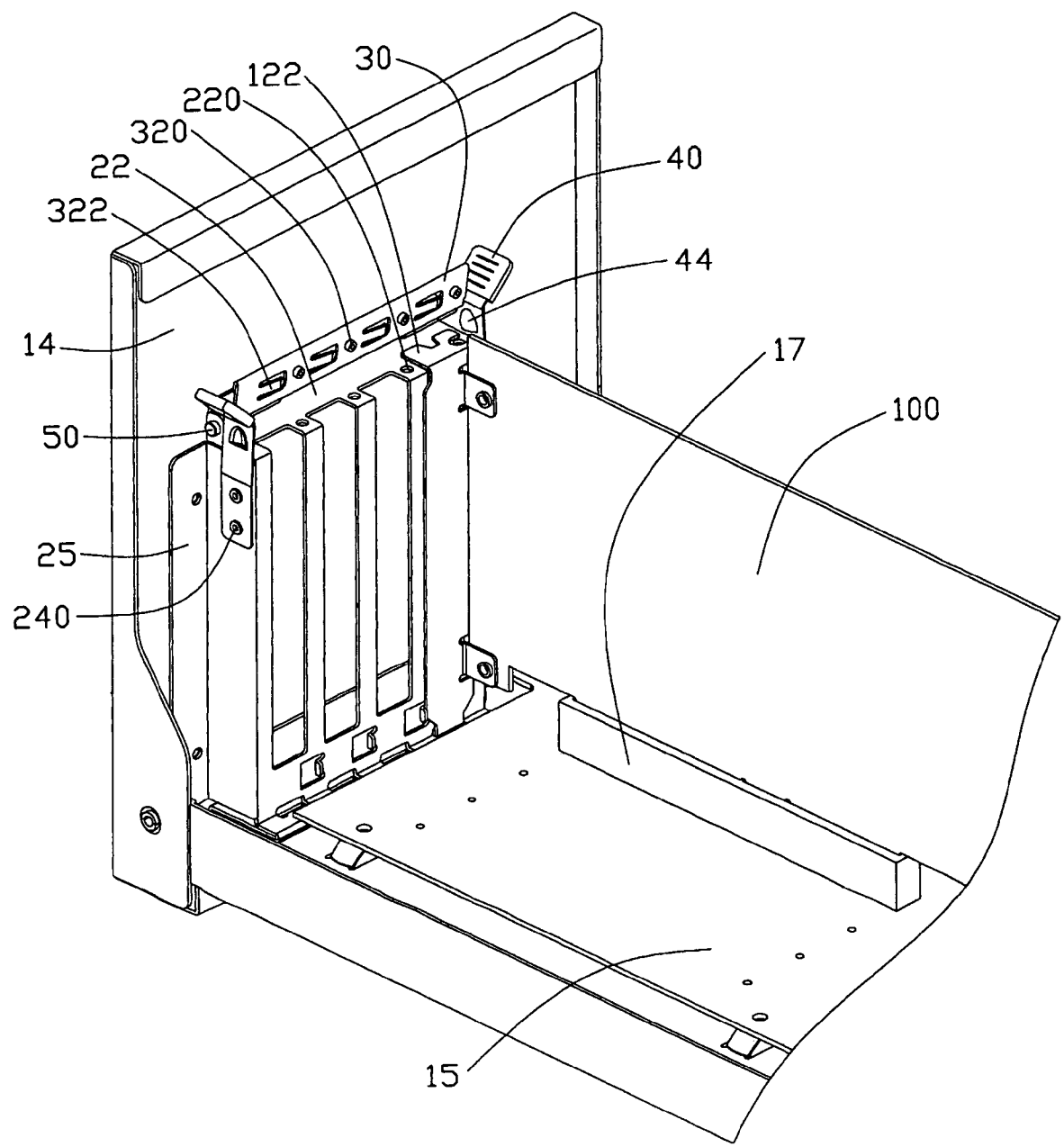
FIG. 4 is an assembled view of FIG. 1, showing the expansion card in a released state.

Referring to FIG. 2, the pressing body 30 has a main pressing portion 32, and two rolled tabs 34 at opposite ends of the pressing portion 32. Each rolled tab 34 defines a pivot hole 340 therein. As best seen in FIG. 4, a plurality of positioning posts 320 extends from the pressing portion 32, corresponding to the positioning holes 220 of the support plate 22. A plurality of evenly spaced spring fingers 322 extends at slight angles from the pressing portion 32, for resiliently pressing one or more end portions 122 of one or more slot covers 120. When the pivot axle 50 is extended through the pivot holes 230 of the projections 23 and the pivot holes 340 of the rolled tabs 34, the pressing body 30 is pivotably mounted to the mounting frame 20 above the support plate 22 thereof. A locking ring 52 engages around an end portion of the pivot axle 50, so as to secure the pivot axle 50 in the pivot holes 230, 340.

Figure 3:
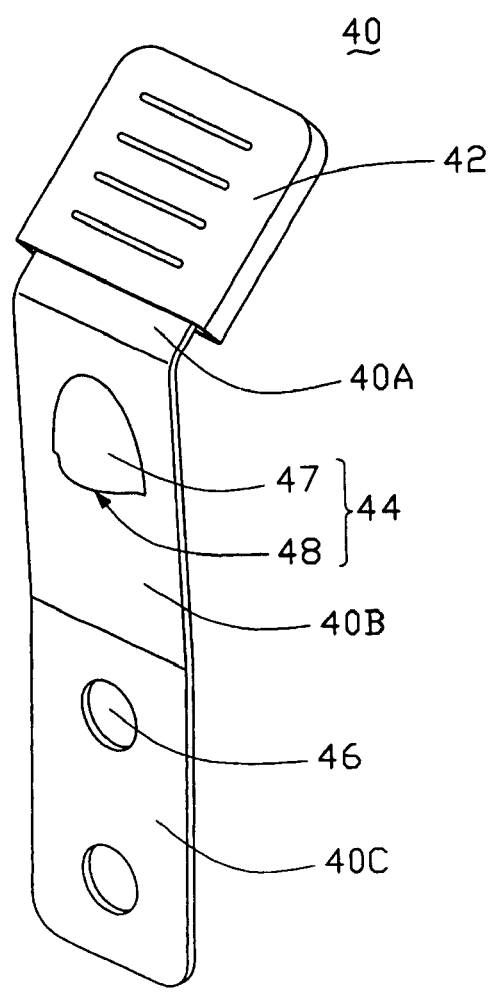
FIG. 3 is an enlarged, isometric view of one of the retention members of the mounting apparatus of FIG. 1.

Referring to FIG. 3, each retention member 40 is made from resilient material such as plastic. The retention member 40 sequentially comprises an operation portion 40A, a retention portion 40B and a mounting portion 40C integrally joined together at respective bent junctions therebetween. A pair of mounting holes 32 is defined in the mounting portion 40C, corresponding to the mounting posts 240 of a respective one of the side plates 24. A protrusion 44 is inwardly formed on the retention portion 40B. The protrusion 44 comprises a convex main surface 47, and an engaging face 48 interconnecting a bottom end of the main surface 47 with the retention portion 40B. The engaging face 48 is generally perpendicular to the retention portion 40B. The engaging face 48 is for engaging with a corresponding end of the pressing body 30. A cap 42 is attached to the operation portion 40A, for facilitating operation of the retention member 40.

Figure 5:
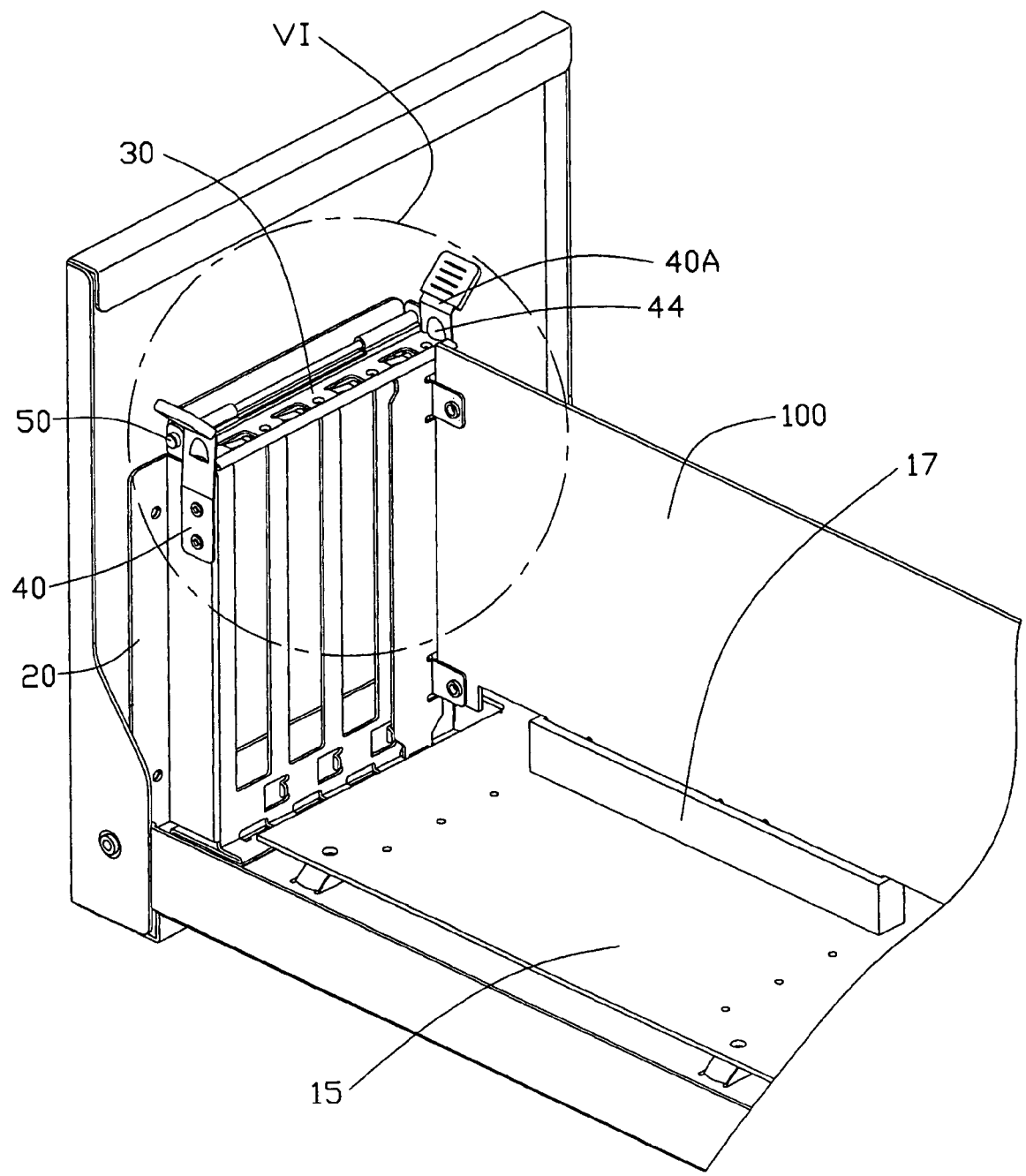
FIG. 5 is similar to FIG. 4, but showing the expansion card in a locked state.
Figure 6:
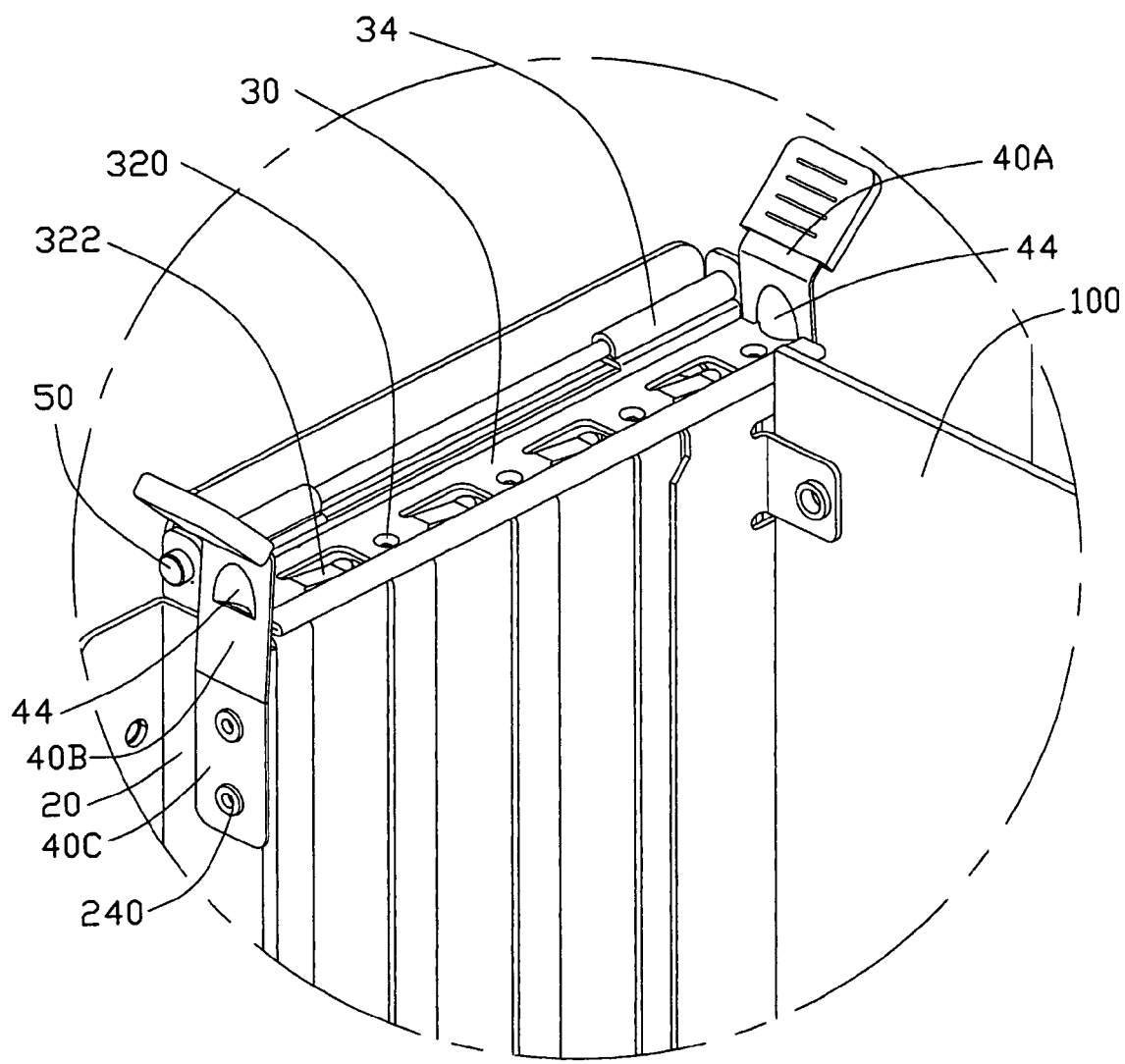
FIG. 6 is an enlarged view of an encircled portion VI of FIG. 5.

Referring to FIGS. 4 through 6, in assembly, the mounting frame 20 is attached to the rear panel 14, with said fasteners extending through the mounting holes 250, 18 of the mounting plate 25 and rear panel 14. The pressing body 30 is pivotably attached to the mounting frame 20, with the pivot axle 50 extending through the pivot holes 230, 340 of the projections 23 and pressing body 30, and the locking ring 52 being engaged around said end portion of the pivot axle 50. The retention members 40 are fixedly attached to the side plates 24 respectively. The mounting posts 240 of the side plates 24 are extended through the mounting holes 46 of the retention members 40, and ends of the mounting posts 240 are expanded to retain the retention members 40 to the side plates 24. Alternatively, other fastening means such as rivets may be used. Prior to installation of the expansion card 100, the pressing body 30 is rotated so that it is positioned above the protrusions 44 of the retention members 40.

To install the expansion card 100, the connecting portion 112 of the expansion card 100 is connected to connector 17 of the motherboard 15, the slot cover 120 is placed to cover a corresponding expansion slot 210, and the cutout 124 is aligned with a corresponding positioning hole 220 of the support plate 22. The pressing body 30 is rotated down toward the slot cover 120. The ends of the pressing body 30 slidingly ride over the corresponding convex main surfaces 47 of the protrusions 44, thereby elastically deforming the retention portions 40B outwardly. After the ends of the pressing body 30 have completely ridden over the protrusions 44, the retention portions 40B spring back to their original states, and the ends of the pressing body 30 are thus snappingly engaged under the engaging faces 48 of the protrusions 44 respectively. Simultaneously, a corresponding spring finger 322 resiliently presses the end portion 122 of the slot cover 120, and a corresponding positioning post 320 extends through the cutout 124 and into a corresponding positioning hole 220. The end portion 122 is sandwiched between the pressing member 30 and the support plate 22, and the expansion card 100 is accordingly secured within the chassis 10 by the mounting apparatus.

To remove the expansion card 100, the caps 42 of the operation portions 40A are pushed outwardly to disengage the protrusions 44 from the ends of the pressing body 30. The pressing body 30 is then rotated up from the end portion 122 of the slot cover 120 to release the spring finger 322 from the end portion 122, and to release the positioning post 320 out from the cutout 124 and positioning hole 320. If the spring fingers 322 have sufficient resiliency, the pressing body 30 can be automatically rotated up by the resilient force of the spring fingers 322 themselves. The expansion card 100 is then easily removed from the chassis 10.

In the present invention, the pressing body 30 is pivotably mounted to the mounting frame 20. When removing or installing the expansion card 100, it is not necessary to remove the pressing body 30. In addition, the pressing body 30 is snappingly engaged with the end portion 122 of the slot cover 120. These features allow quick and convenient installation and removal of the expansion card 100.

Figure 7:
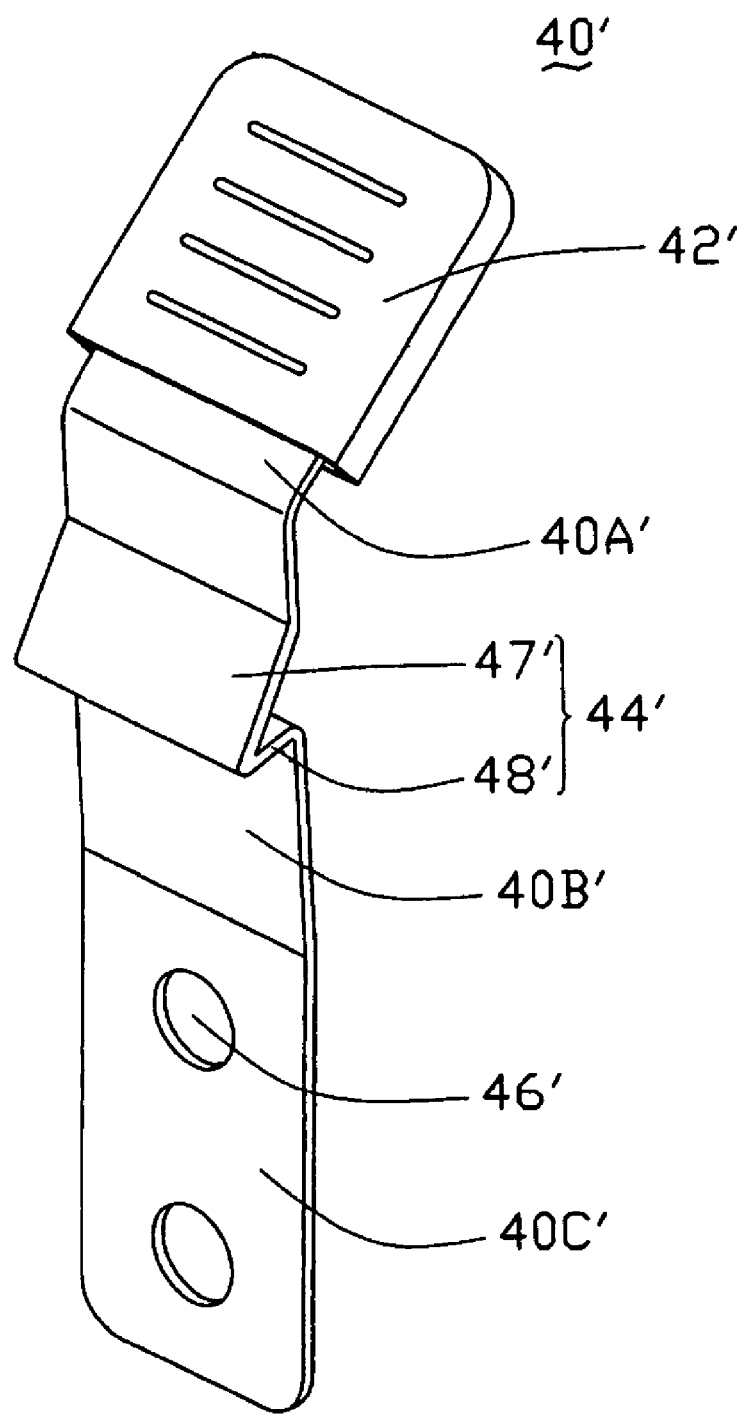
FIG. 7 is an isometric view of a retention member in accordance with an alternative embodiment of the present invention.

FIG. 7 illustrates a retention member 40' in accordance with an alternative embodiment of the present invention. The retention member 40' is similar to the retention member 40 of the preferred embodiment, and comprises an operation portion 40A', a retention portion 40B' and a mounting portion 40C'. A cap 42' is attached to the operation portion 40A'. A pair of mounting holes 46' is defined in the mounting portion 40C'. A portion of the retention portion 40B' is stamped to form a protrusion 44'. The protrusion 44' comprises an inclined plate 47', and an engaging plate 48' generally perpendicular to the retention portion 40B'. The engaging plate 48' is used for engaging with a corresponding end of the pressing body 30 so as to retain the pressing body 30 in place.

Although only one expansion card 100 is included in the above description, the expansion card mounting apparatus of the present invention is equally capable of mounting a plurality of expansion cards 100 at the same time.

In a further alternative embodiment of the present invention, the pressing body 30 may be pivotably mounted to the mounting frame 20 as follows. The rolled tabs 34 may be lengthened so that they extend through the pivot holes 230 and function as pivot axles. In such case, the pressing body 30 pivots about the rolled tabs 34. The pivot axle 50 and locking ring 52 of the preferred embodiment are not needed, and accordingly manufacturing costs are reduced. Further, the pressing body 30 may alternatively be directly pivotably mounted to the rear panel 14.

In a still further alternative embodiment of the present invention, the mounting frame 20 may be integrally formed with the rear panel 14.

It is understood that the invention may be embodied in other forms without departing from the spirit thereof. Thus, the present examples and embodiments are to be considered in all respects as illustrative and not restrictive, and the invention is not to be limited to the details given herein.

The invention claimed is:

1. A mounting apparatus for expansion cards, each of the expansion cards comprising a slot cover having a bent end portion, the mounting apparatus comprising:

a panel defining an opening;

a mounting frame attached to the panel around the opening, the mounting frame comprising a support member for supporting the end portion of the slot cover;

a pressing body pivotably mounted to either the mounting frame or the panel; and a flexible retention member attached to the mounting frame, the retention member having a protrusion formed thereon;

wherein the pressing body flexes the retention member, and when the pressing body is pivoted to an engaging position in which the pressing body presses the end portion against the support member, the retention member springs back to have the protrusion snappingly engaging with the pressing body so as to retain the pressing body in said engaging position.

2. The mounting apparatus as described in claim 1, wherein pivot holes are defined in the pressing body and in either the mounting frame or the panel, and a pivot axle extends through the pivot holes.

3. The mounting apparatus as described in claim 2, wherein the pivot hole of the pressing body is defined by a rolled tab thereof.

4. The mounting apparatus as described in claim 1, wherein the support member defines a positioning hole, the end portion of the slot cover defines a cutout, and the pressing body comprises a positioning post extending through the cutout into the positioning hole.

5. The mounting apparatus as described in claim 1, wherein the pressing body comprises a spring finger for resiliently pressing the end portion of the slot cover.

6. The mounting apparatus as described in claim 1, wherein the protrusion of the retention member comprises a convex main surface, and an engaging face interconnecting a bottom end of the main surface with the retention member.

7. The mounting apparatus as described in claim 1, wherein the retention member is stamped to form the protrusion, and the protrusion comprises an inclined plate and an engaging plate interconnecting a bottom end of the inclined plate with the retention member.

8. The mounting apparatus as described in claim 1, wherein the retention member comprises a retention portion on which the protrusion is formed, a mounting portion attached to the mounting frame, and an operation portion adjoining the retention portion.

9. A mounting apparatus assembly comprising:

a panel comprising a mounting frame, the mounting frame having a support member supporting an end portion of a slot cover of an expansion card;

a pressing body pivotably mounted above the support member, the pressing body comprising a pressing portion pressing the end portion of the slot cover against the support member; and a pair of flexible retention members located at opposite sides of the mounting frame, each of the retention members comprising a retention portion engaging with a respective end of the pressing body to retain the pressing body in place;

wherein when the retention members are flexed outwardly, the pressing body is rotated away from the end portion whereby the end portion is released.

10. The mounting apparatus assembly as described in claim 9, wherein the pressing body comprises at least one rolled portion functioning as a pivot axle.

11. The mounting apparatus assembly as described in claim 9, wherein the pressing body comprises at least one rolled portion defining a pivot hole therein.

12. The mounting apparatus assembly as described in claim 9, wherein the support member defines a positioning hole, the end portion defines a cutout, and the pressing body comprises a positioning post extending through the cutout into the positioning hole.

13. The mounting apparatus assembly as described in claim 9, wherein the pressing body comprises a spring finger resiliently pressing the end portion against the support member.

14. The mourning apparatus assembly as described in claim 13, wherein the spring finger has sufficient resiliency to rotate the pressing body upwardly when the retention members are flexed outwardly.

15. The mounting apparatus assembly as described in claim 9, wherein the retention portion comprises a protrusion snappingly engaging with the respective end of the pressing body.

16. The mounting apparatus assembly as described in claim 15, wherein the protrusion comprises a convex main surface, and an engaging face interconnecting the main surface with the retention portion, the engaging face being generally perpendicular to the retention portion.

17. The mounting apparatus assembly as described in claim 15, wherein the retention portion is stamped to form the protrusion, and the protrusion comprises an inclined plate and an engaging plate, the engaging plate being generally perpendicular to the retention portion.

18. The mounting apparatus as described in claim 9, wherein each of the retention members further comprises a mounting portion secured to either the mounting frame or the panel, and an operation portion adjoining the retention portion.

19. The mounting apparatus assembly comprising:

a panel having a mounting frame structure thereon, said mounting frame structure including a plurality of spaced expansion slots, along a lengthwise direction of said frame structure, with a support member above said expansion slots;

at least an expansion card including a slot cover with an end portion seated upon said support member;

a pressing body pivotally mounted relative to the panel and above said support member and defining thereof a pivot axis extending along said lengthwise direction, the pressing body including a pressing portion cooperating with said support member to sandwich said end portion therebetween; and at least one retention member fixed to the panel and being flexible in said lengthwise direction, and defining a retention portion downwardly pressing against a portion of said pressing body when said retention member is in a normal condition.

20. The assembly as described in claim 19, wherein said portion of the pressing body is an end of the pressing body.

* * * * *